United States Patent
Ono et al.

(10) Patent No.: US 6,726,780 B2
(45) Date of Patent: Apr. 27, 2004

(54) LEAD-FREE SOLDER, AND PASTE SOLDER COMPOSITION

(75) Inventors: Takao Ono, Saitama (JP); Mitsuru Iwabuchi, Saitama (JP); Kenji Fujimori, Saitama (JP); Hiroaki Koyahara, Saitama (JP)

(73) Assignee: Tamura Kaken Corporation, Saitama (JP)

( * ) Notice: Subject to any disclaimer, the term of this patent is extended or adjusted under 35 U.S.C. 154(b) by 0 days.

(21) Appl. No.: 10/384,829

(22) Filed: Mar. 10, 2003

(65) Prior Publication Data

US 2003/0178101 A1 Sep. 25, 2003

(30) Foreign Application Priority Data

Mar. 20, 2002 (JP) ........................................ 2002-077437

(51) Int. Cl.$^7$ ............................................... B23K 35/22
(52) U.S. Cl. ............................. 148/24; 75/252; 148/25; 420/561
(58) Field of Search ............................. 75/252; 148/24, 148/25; 420/561

(56) References Cited

U.S. PATENT DOCUMENTS

| | | | |
|---|---|---|---|
| 4,879,096 A | | 11/1989 | Naton |
| 5,480,731 A | * | 1/1996 | Carey et al. ................. 428/648 |
| 5,527,628 A | | 6/1996 | Anderson et al. |
| 5,538,686 A | * | 7/1996 | Chen et al. ................. 420/557 |
| 6,075,080 A | * | 6/2000 | Katsuoka et al. ........... 524/272 |
| 6,428,911 B2 | * | 8/2002 | Kitajima et al. ............ 428/674 |

FOREIGN PATENT DOCUMENTS

| | | | |
|---|---|---|---|
| JP | 62-107896 | | 5/1987 |
| JP | 401057999 | * | 3/1989 |
| JP | 55-050995 | | 4/1989 |
| JP | 11-114691 | | 4/1999 |
| JP | 3027441 | | 1/2000 |

* cited by examiner

*Primary Examiner*—Ngoclan T. Mai
(74) *Attorney, Agent, or Firm*—King & Schickli, PLLC

(57) ABSTRACT

There is provided a lead-free solder which makes it possible to reliably and accurately perform the inspection of various kinds of defective soldering in the inspection using an image inspection apparatus after the reflow soldering. According to this lead-free solder, the delustering of the metallic luster of fillet is realized in order to minimize the probability of generating a dark portion at the area where no defective soldering is existed and instead to increase the area of whitish portion which can be generated through the irregular reflection of beam. Specifically, this invention provides a lead-free solder comprising an Sn—Ag—Cu-based lead-free solder containing a small quantity of Bi and Sb as an element which is capable of generating a delustering component for minimizing metallic luster of the fillet.

4 Claims, No Drawings

LEAD-FREE SOLDER, AND PASTE SOLDER COMPOSITION

This application claims priority to Japanese Patent Application No. 2002-077437, filed Mar. 20, 2002.

TECHNICAL FIELD

The present invention relates to a so-called lead-free solder which is capable of forming a fillet that can be utilized for improving the accuracy of inspection in the detection of a defective soldering of soldered portions of a wiring board by means of an automatic inspection apparatus which is designed to detect such a defective soldering by making use of a reflected beam. The present invention also relates to a solder paste comprising the powder of the lead-free solder.

BACKGROUND OF THE INVENTION

In recent years, concomitant with an increasing trend to multi-functionalize the wiring board of electronic devices as well as with an increasing trend of miniaturization, i.e. the reduction of the size and weight of electronic devices, a surface mounting technique has now been quickly advanced, and therefore, most of the surface mounting of electronic devices are now being performed by means of a reflow soldering method using a solder paste. As for the solder powder to be employed for this solder paste, an Sn—Pb-based powder is predominantly employed.

By the way, when electronic instruments are to be scrapped because of the reasons that the electronic instruments are no longer useful for instance, the electronic instruments may be disintegrated to recover some components thereof. However, at present, most of the substrates having electronic components mounted thereon are crushed into pieces and buried underground without being recovered, or otherwise may be discarded as they are, thus leaving them in fields.

Since the substrates discarded in fields in this manner are provided with electronic components which are attached to the substrates by means of soldering, if lead is contained in the solder, the lead may be turned into a soluble lead compound due to the effects of acid rain, etc., thus not only polluting the natural environments but also raising probabilities that water or animal and vegetable foods which are contaminated through underground water, etc. may be taken into human body. Since the toxicity of such contaminated water and foods is strong, it may raise a serious problem.

With a view to avoid such problems mentioned above, solder materials which are free from lead have been developed, and so-called lead-free solder powder made of an Sn—Ag alloy, an Si—Ag—Cu alloy, etc. is now increasingly employed.

However, since the lead-free solder powder mentioned above is relatively high in melting point, i.e. about 200° C. to 220° C., it is required, in the reflow soldering method employing a solder paste containing the aforementioned lead-free solder powder, to set the peak temperature to 230° C. to 240° C. on the occasion of heating the solder paste. Therefore, there is a problem in the employment of the lead-free solder that the properties of electronic components to be soldered may be deteriorated due to the thermal damage thereof to be caused by the soldering. By contrast, in the case of reflow soldering method where a solder paste containing a lead-based solder powder such as an Sn—Pb alloy powder is employed, it is possible to set the peak temperature to about 230° C. on the occasion of heating the solder paste because of the fact that the melting point of the eutectic composition thereof (63Sn/37Pb) is as low as 183° C., thereby enabling the soldering to be performed without damaging the electronic components which are vulnerable to heating.

In order to avoid the problems mentioned above, it is desired to develop a lead-free solder whose melting point is as low as possible. With a view to meet such demands, there have been proposed various kinds of lead-free solder such as an Sn—Ag—Cu-based lead-free solder (Japanese Patent No. 3,027,441 and U.S. Pat. No. 5,5276,28); an Sn—Ag—Cu—Bi-based lead-free solder (U.S. Pat. No. 4,879,096); etc. In Japan, there is an increasing trend at present to mainly employ an Sn—Ag—Cu-based lead-free solder.

By the way, on the occasion of mounting electronic components on a wiring board by means of a reflow soldering method, procedures are taken wherein a solder paste is coated at first on a solder land of the wiring board, a chip-like electronic component is temporarily secured to the wiring board by making use of the adhesive force of the coated paste in such a manner that the electrodes or leads of the electronic component are positioned in alignment with the solder land, and then, the solder paste is heated to melt the solder powder in the coated film of the solder paste to thereby perform the soldering. Alternatively, a solder paste is coated at first on the through-holes provided in the wiring board, and after the leads of an electronic component are inserted into the through-holes, the solder paste is heated in the same manner as described above to thereby perform the soldering.

The aforementioned soldering of an electronic component is required to be performed on a large number of locations of a single wiring board, and moreover, since 1005 pieces of chips for instance each being very small (1 mm in length and 0.5 mm in width) and light-weight are required to be soldered onto a narrow solder land, i.e. as the density of electronic components to be mounted on a single wiring board is increased further, it becomes more difficult to perform the soldering without generating defective soldering. Further, this defective soldering is versatile in features, it includes, for example, the lifting of pin (a phenomenon wherein the pin of lead is lifted up without being soldered onto the solder land), wettability failure (a phenomenon wherein a fused solder fails to fully spread all over the surface required to be coated, thus permitting the soldering to be performed only partially), solder bridge (a phenomenon wherein the space between soldering lands is bridged with a solder), solder ball(a phenomenon wherein fused solder is exuded outside the solder land and formed into a ball on the surface of a solder resist film), abnormal shaping of solder fillet (a phenomenon wherein the fillet of solder at the soldered portion is distorted), the dislocation of electronic component, and Manhattan phenomenon (a phenomenon wherein one side of an electronic component is caused to rise due to a difference in surface tension of fused solder acting on the electrodes of electronic component and on the soldering lands until the fused solder is solidified). Since these phenomena may give rise to the generation of short circuit of wiring, and to the detachment of the electronic components due to the failure of the solder to obtain a predetermined bonding strength. Therefore, when the wiring board having electronic components soldered thereon is to be delivered as a product, all of the soldered portions are subjected to inspection so as to see if there is any defective soldering.

Although this inspection can be performed by way visual inspection, this inspection is now generally performed by making use of an automatic inspection apparatus in order to improve the inspection efficiency and the inspection precision. As for the specific methods of the inspection that are adopted at present, there are known, for example, an X-ray transmission system, an ultrasonic flaw detector, a laser system, etc. Among them, the laser system is performed by making use of an image inspection apparatus wherein an LED laser (laser to be derived from a light-emitting diode) is irradiated against the fillet of the soldered portion or the periphery thereof so as to measure the reflectance of the reflected beam. Since the fillet generally exhibits metallic luster or so-called mirror luster and is semi-circular in longitudinal cross-section, it is more likely that the area of dark portion of the image (the portion where irregular reflection is not generated) relative to the area of whitish portion (the portion where irregular reflection is caused to generate) of the image would become relatively large, so that if the ratio of the whitish portion relative to the entire fillet is taken as the reflectance of the fillet, the value of reflectance would become relatively low. However, since the defective solder also looks dark, the portion which looks dark even though the solder is actually existed thereat may be inevitably assumed as being a defectively soldered portion in order to prevent any possibility of overlooking the defective soldering. If such a product is disposed as a defective product because of the aforementioned circumstances, the yield would be deteriorated. If it is desired to deal with this problem, the product is required to be subsequently re-inspected by way of visual inspection, thus deteriorating the efficiency of inspection.

Even on the occasion of performing the visual inspection of the fillet to be inspected, there is a problem that eye strain may be caused to occur due to an excessive magnitude of the reflected beam if the fillet exhibits metallic luster. With a view to overcome such a problem, it is proposed to employ a delustered solder as a lead-containing solder in the soldering using a solder paste wherein the conventional Sn—Pb-based lead-containing solder is employed (Japanese Patent Unexamined Publications (Kokai) S55-509995; S62-107896; and H11-114691). It is mentioned in these publications that the delustered lead-containing solder is capable of minimizing the metallic luster of the fillet. However, these publications fail to disclose or suggest the idea of employing a delustered lead-free solder as a lead-free solder in the soldering using a solder paste wherein a lead-free solder is employed. Therefore, it has been strongly desired to develop a lead-free solder which is capable of forming a fillet which enables to enhance the probability of exhibiting darkness only when there are the aforementioned soldering defects while exhibiting whiteness when the solder is actually existed thereat in the aforementioned image inspection in order to enable all of the aforementioned versatile defects to be detected reliably and accurately with respect to all of the electronic component-soldered portions on the soldering lands which are formed in a large number and minute intervals.

SUMMARY OF THE INVENTION

Therefore, a first object of this invention is to provide a lead-free solder which is capable of forming a fillet where the metallic luster thereof is minimized or delustered, and to provide a solder paste made from the aforementioned lead-free solder.

A second object of this invention is to provide a lead-free solder which is capable of forming a soldered portion which enables the inspection of defective soldering to be performed reliably and accurately by making use of an image inspection apparatus employing the laser system for instance, and to provide a solder paste made from the aforementioned lead-free solder.

A third object of this invention is to provide a lead-free solder which is capable of preventing the solderability thereof from deteriorating, and to provide a solder paste made from the aforementioned lead-free solder.

A fourth object of this invention is to provide a lead-free solder which enables to form an electronic components-mounted substrate having a highly reliable circuit, and to provide a solder paste made from the aforementioned lead-free solder.

As a result of intensive studies made by the present inventors with a view to solve the aforementioned objects, it has been found unexpectedly that when Bi and Sb are incorporated in an Sn—Ag—Cu-Based lead-free solder for instance, it is possible to obtain a delustered fillet even if the amount of Bi and Sb is relatively small, thereby making it possible to minimize the area of dark portion relative to the area of whitish portion as far as normal fillet is concerned in the inspection of soldering by making use of an image inspection apparatus based on a laser system, and therefore to enhance the reflectance. As a result, it has been found possible to reliably and accurately perform the inspection of the aforementioned various kinds of defective soldering without deteriorating the solderability of the lead-free solder, thus accomplishing the present invention.

Namely, the present invention provides (1) a lead-free solder comprising an element which is capable of generating a delustering component for minimizing metallic luster of the solder.

The present invention also provides (2) a lead-free solder comprising 2.0 to 4.0% of Ag, 0.1 to 1.0% of Cu, 0.05 to 0.5% of Bi, 0.05 to 0.5% of Sb, and the balance of Sn.

The present invention also provides (3) a solder paste composition comprising the powder of the lead-free solder according to the aforementioned item (1) or (2), a rosin-based resin, an activating agent, and a solvent. By the way, "%" herein means "mass %".

DETAILED DESCRIPTION OF THE INVENTION

In the description of this invention, by the expression of "a lead-free solder comprising an element which is capable of generating a delustering component for minimizing metallic luster of the solder ", it is intended to include a solder comprising substantially no lead component, such as an Sn—Ag—Cu-based leadless solder, more specifically "a lead-free solder which comprises 2.0 to 4.0% of Ag, 0.1 to 1.0% of Cu, 0.05 to 0.5% of Bi, 0.05 to 0.5% of Sb, and the balance of Sn". This solder as well as a solder of this type where Bi and Sb are not included therein are preferable since they are provided with essential properties required in the soldering of this kind, such as suitable soldering work temperature, excellent wettability of fused solder to the electrodes of electronic component or to the soldering land (or wet-spreadability of a fused solder to a portion to be soldered), excellent bonding strength after soldering, etc. By the way, by the expression of "a solder comprising", it is intended to mean that the solder may be solely composed of the essential components thereof, or may include any unavoidable impurities.

The lead-free solder according to the present invention include other kinds of lead-free or leadless solder, such as an Sn—Ag-based alloy, an Sn—Ag—Cu-based alloy, an Sn—Ag—Bi-based alloy, an Sn—Bi-based alloy, an Sn—Ag—Cu—Bi-based alloy, an Sn—Sb-based alloy, an Sn—Cu-based alloy, etc. It is also possible to employ an Sn—Zn-based alloy.

When the lead-free solder according to the present invention is composed of "an alloy comprising 2.0 to 4.0% of Ag, 0.1 to 1.0% of Cu, 0.05 to 0.5% of Bi, 0.05 to 0.5% of Sb, and the balance of Sn", it includes a very small amount (0.5% or less (at most 0.5%)) of Bi and Sb, both functioning as an element which is capable of generating a delustering component.

If the content of Ag is confined within the range of 2.0 to 4.0% in the aforementioned composition, it is preferable in the respects that the melting point of the lead-less solder can be lowered and that the bonding strength of soldering can be improved. If the content of Ag is less than 2%, it may become difficult to improve the bonding strength of soldering. On the other hand, if the content of Ag exceeds over 4%, it is difficult to further improve the properties thereof such as solderability in spite of expensiveness in doing so. If the content of Cu is confined within the range of 0.1 to 1.0% in the aforementioned composition, it is preferable in the respects that the wettability of the fused solder of lead-less solder to the soldering portion (for example, the electrodes of electronic component and the soldering land) can be improved and that the bonding strength of soldering can be improved. If the content of Cu is less than 0.1%, it may become difficult to obtain the aforementioned preferable effects. On the other hand, if the content of Cu exceeds over 1.0%, the fluidity of the fused solder of lead-less solder would be deteriorated and the melting point of the solder would be caused to rise, thus making it difficult to improve the properties of the solder such as solderability thereof. If the content of Bi is confined within the range of 0.05 to 0.5%, and Sb is confined within the range of 0.05 to 0.5% in the aforementioned composition, the fillet to be obtained through the cooling and solidification of the fused solder of lead-free solder would be of such features that the metallic luster of the fillet can be greatly reduced as compared with that of the fillet to be obtained from the lead-free solder which is composed of the same composition as mentioned above except that these Bi and Sb components are excluded therefrom, thus effectively delustering the fillet.

The reason for this delustering effect may be assumably attributed to the fact that segregation is permitted to generate on the surface of fillet in the course of forming the fillet, enabling these additive elements to become a constituent component of the segregated substance, thus resulting in the delustering of the fillet. However, the reason for this delustering effect should not be construed as being limited by the aforementioned assumption. If the content of Bi and Sb is less than the aforementioned lower limit, it may become difficult to obtain the aforementioned preferable delustering effects. On the other hand, if the content of Bi exceeds over the aforementioned upper limit, the soldering strength to be obtained from the lead-free solder may be deteriorated, whereas if the content of Sb exceeds over the aforementioned upper limit, the melting point of the lead-free solder may be caused to rise.

As described above, it is possible to preferably perform the delustering of fillet by the incorporation of a small quantity (0.5% or less (0.5% at most)) of Bi and Sb. However, these elements can be employed as being capable of generating a delustering component for the aforementioned other kinds of lead-free solder. Furthermore, it is possible, other than the employment of these elements and the preferable ratio thereof in the solder, to employ any other elements which are capable of, other than through the generation of similar segregation, delustering the metallic luster of solder as compared with the conventional solders.

When the delustering of fillet is performed in this manner, the delustered surface is capable of irregularly reflect the beam, thereby enabling the fillet to be looked whitish in the image to be produced by an automatic image inspection apparatus of laser system. As a result, it is possible to improve the reflectance of the whitish area to increase the ratio of the whitish area relative to the total of whitish area and the dark area. Therefore, it is now possible to enhance the probability of accuracy in determining the area of low reflectance (relative to the standard value of reflectance of flawless soldered portion) as being unacceptable due to the occurrence of any one of versatile defective solderings. Namely, it is now possible to reliably find a defective solder in an automatic inspection, thus enhancing the accuracy of inspection. If the inspection step of soldering is enhanced in efficiency, the entire soldering operation including this inspection step can be greatly enhanced in efficiency.

The lead-free solder powder to be employed for the manufacture of the solder paste according to the present invention can be employed at a ratio of 85–92% by weight (flux: 8–15% by weight) based on a solder paste. In this case, fine metal powder each being spherical in shape and having a particle diameter ranging from 10 to 45 $\mu$m is suited for use in a reflow solder to be employed in the manufacture of the current printed circuit board wherein the pitch of solder lands is increasingly narrowed.

As for the rosin-based resin that can be employed in the manufacture of the solder paste according to the present invention, it is possible to employ rosin and the derivatives of rosin such as a modified rosin. These rosin and derivatives may be co-used. More specifically, it is possible to employ gum rosin, wood rosin, polymerized rosin, phenol-modified rosin, and the derivatives thereof. The content of the rosin-based resin may be in the range of 30 to 70% by weight based on so-called flux or all of the solder paste components excluding the solder powder. If the content of the rosin-based resin is less than this lower limit, so-called solderability of the solder paste (i.e. the ability of the solder paste to prevent the oxidation of copper foil surface of soldering land to thereby improving the wettability thereof to the fused solder) would be deteriorated, thus giving rise to the generation of solder balls. On the other hand, if the content of the rosin-based resin is larger than this upper limit, the quantity of residue would be increased.

As for the activating agent, it is possible to employ hydrohalogenates of organic amine and organic acid. More specifically, it is possible to employ diphenyl guanidine hydrobromate, cyclohexyl amine hydrobromate, diethyl amine hydrobromate, triethanol amine hydrobromate, monoethanol amine hydrobromate, adipic acid, sebacic acid, etc. The content of these activating agent should preferably be in the range of 0.1 to 3% by weight based on the flux in terms of inhibiting the generation of corrosion by the effects of the residue thereof, and of preventing the generation of damage to the insulation resistance, and in terms of solderability and of preventing the generation of solder balls.

A thixotropic agent may be employed for adjusting the viscosity of a solder paste so as to optimize the printing characteristics of the solder paste. For instance, hydrogenated castor oil, fatty acid amides and oxyfatty acids may be employed for this purpose, the mixing ratio of which being preferably in the range of 3 to 15% by weight based on the flux.

As for the solvent, those which are commonly employed for the solder paste can be employed. For instance, hexylcarbitol (boiling point: 260° C.), butylcarbitol (boiling point:

230° C.), etc. can be employed, the mixing ratio of which being preferably in the range of 30 to 50% by weight based on the flux.

The solder paste according to the present invention may contain an antioxidant consisting of a hindered phenolic compound. More specifically, this antioxidant may be added to the flux for instance, and the resultant flux is mixed with the powder of aforementioned lead-free solder.

As for the kinds of the hindered phenolic compound, although there is not any particular limitation, specific examples thereof include triethylenegylcol bis[3-(3-t-butyl-5-methyl-4-hydroxyphenyl)propionate], 1,6-hexanediol-bis-[3-(3,5-t-butyl-4-hydroxyphenyl)propionate], 2,4-bis (n-octylthio)-6-(4-hydroxy-3,5-di-t-butylanilino)-1,3,5-triazine, pentaerythrityl tetrakis[3-(3,5-di-t-butyl-4-hydroxyphenyl)propionate], 2,2-thio-diethylene bis[3-(3,5-t-butyl-4-hydroxyphenyl)propionate], octadecyl-3-(3,5-t-butyl-4-hydroxyphenyl)propionate, N,N'-hexamethylene bis (3,5-t-butyl-4-hydroxy-hydrocinnamide), 3,5-t-butyl-4-hydroxybenzyl phosphonate-diethyl ester, 1,3,5-trimethyl-2, 4,6-tris(3,5-t-butyl-4-hydroxybenzyl)benzene, etc.

Among these hindered phenolic compounds, it is especially preferable to select those having a molecular weight of 500 or more because of the fact that they are excellent in thermal stability.

The antioxidant consisting of a hindered phenolic compound may be preferably incorporated into a flux at a ratio of 10% or less (10% at most). Because if this anti-oxidant is added larger than 10%, the solderability of the solder may be deteriorated.

The solder paste according to the present invention can be employed in such a way that after a circuit wiring pattern is formed, by means of etching treatment, on the surface of a copper-clad laminate, or after a soft etching treatment is further performed on the copper-clad laminate so as to remove copper oxides formed on the surface of the circuit wiring pattern, the solder paste is printed on the surface of the circuit board having the aforementioned wiring pattern, thereby enabling the solder paste to be utilized as a protective film for protecting the wiring pattern from being oxidized until a soldering step is performed thereon. Alternatively, the solder paste may be utilized so as to provide a printed circuit board having a residual film of flux (a residual film of flux to be obtained after the reflow of solder or after the soldering), which may be obtained after the reflow soldering.

In view of above, the present invention may be defined as being "A method of reflow soldering which comprises a step of reflow-soldering an electronic component onto a soldering portion of a printed circuit board by making use of the lead-free solder as defined in any one of the aforementioned items (1) to (3) or by making use of a solder paste composition comprising this lead-free solder.".

EXAMPLES

Followings are the explanation of specific examples which are not intended to restrict the scope of the present invention.

Example 1

| Hydrogenated rosin (rosin-based resin) | 55.0 g |
| Adipic acid (activating agent) | 2.0 g |

-continued

| Hydrogenated castor oil (thixotropic agent) | 6.0 g |
| Triethyleneglycol-bis[3-(3-t-butyl-5-methyl-4-hydroxyphenyl) propionate] | 4.0 g |
| Hexyl carbitol (solvent) | 33.0 g |
| Above being components of a flux | (total = 100 g) |
| This flux | 11.0 g |
| Solder powder | 89.0 g |
| (Ag = 3.0%, Cu = 0.5%, Bi = 0.10%, Sb = 0.12% Sn = balance) | |
| Above being components of a flux | (total = 100 ) |

Then, the aforementioned flux and solder powder were mixed together and agitated to obtain a solder paste. When the viscosity of this solder paste was measured by making use of Malcolm viscometer, the viscosity thereof was found 210 Pa·s (measured at a temperature of 25° C.).

Then, this solder paste was subjected to the following tests, i.e. (1) Delustering property test (a test to measure the ratio (%) of the dark area in the fillet obtained after reflow soldering relative to the entire area of image by making use of an image inspection apparatus (visual inspection apparatus) which was designed based on an LED (light emitting diode) system (namely, if any defective soldering is existed, the defective soldering can be recognized as a dark image, while the whitish area is considered as being an irregularly reflected portion originated from a normally soldered portion)); (2) Printability test (a test to examine if a thin spot or bleeding can be visually recognized on a printed surface produced by a screen printing where a metal mask having a thickness of 0.15 mm was employed); (3) Viscosity test (a test based on JIS Z 3284 to examine the peelability of the metal mask after printing); (4) Sagging resistance test under a heated condition (a test based on JIS Z 3284 to examine any squeeze-out to be generated from a predetermined place of a coated film under a heated condition); (5) Insulation test (a test based on JIS Z 3284 to measure the resistance of a flux film separated from a solder); (6) Solderability test (a test to evaluate the solderability when a main heating is performed at a temperature of 24° C. for 30 seconds after a pre-heating which is performed at a temperature of 150° C. for 120 seconds in a reflow soldering apparatus, wherein the solderability is evaluated by a five-grade method in which a state where an unfused portion cannot be recognized at all in a solidified solder after the fusion thereof is defined as being grade 5, and a state where a lot of unfused portions can be recognized in a solidified solder is defined as being grade 1, grades 3 or more being considered as being practically useful). The results are shown in Table 1.

Comparative Example 1

A solder paste was prepared in the same manner as in Example 1 except that a solder powder comprising Ag=3.0%, Cu=0.5%, Bi=0.10% and Sn=the balance was employed substituting the solder powder of Example 1. Table 1 shows the results obtained.

Comparative Example 2

A solder paste was prepared in the same manner as in Example 1 except that a solder powder comprising Ag=3.0%, Cu=0.5%, Sb=0.12% and Sn=the balance was employed substituting the solder powder of Example 1. Table 1 shows the results obtained.

Comparative Example 3

A solder paste was prepared in the same manner as in Example 1 except that a solder powder comprising Ag=3.0%, Cu=0.5% and Sn=the balance was employed substituting the solder powder of Example 1. Table 1 shows the results obtained.

TABLE 1

| Items assessed | Ex. 1 | Com. Ex. 1 | Com. Ex. 2 | Com. Ex. 3 |
|---|---|---|---|---|
| Delustering | 75% | 43% | 47% | 30% |
| Printability (spot or bleeding) | None | None | None | None |
| Viscosity (N) | 1.2 | 1.2 | 1.2 | 1.2 |
| Sagging resistance under heating (mm) | 0.3 | 0.3 | 0.3 | 0.3 |
| Solderability (pre-heating: 150° C.) | 5 | 5 | 5 | 5 |
| Insulation (Ω) | >5 × $10^{11}$ | >5 × $10^{11}$ | >5 × $10^{11}$ | >5 × $10^{11}$ |

It will be recognized from Table 1 that the solder paste according to Example 1 where small amounts of Bi and Sb were added therein was more excellent in delustering property by a factor of about 1.6–2.5 as compared with the solder pastes of Comparative Examples 1 and 2 wherein either one of Bi and Sb was added therein with the resultant shortage being compensated by the addition of Sn, or compared with the solder paste of Comparative Example 3 wherein both Bi and Sb were not added therein at all with the resultant shortage being compensated by the addition of Sn.

By the way, the invention set forth in the above item (1) may be confined to "A lead-free solder comprising an Sn—Ag—Cu-based lead-free solder containing an element which is capable of generating a delustering component for minimizing metallic luster of the solder", or to "A lead-free solder comprising an Sn—Ag—Cu-based lead-free solder containing up to 0.5% of Bi and up to 0.5% of Sb as an element which is capable of generating a delustering component for minimizing metallic luster of the solder, wherein a mass ratio between Ag and Bi is within the range of 2.0–4.0:0.05–0.5, and a mass ratio between Ag and Sb is within the range of 2.0–4.0:0.05–0.5". The inventions recited in the aforementioned items (2) and (3) may be defined as being dependent on these rewritten definitions of item (1). By the way, the aforementioned "Sn—Ag—Cu-based" may be changed to "Sn—Ag-based". In either case, by the term "-based", it is intended to mean the solder may be constituted solely by the elements indicated clearly therein, or may include other kinds of elements as long as these clearly indicated elements constitute essential constituent elements in the solder.

According to the present invention, it is possible to provide a lead-free solder comprising an element which is capable of generating a delustering component for minimizing metallic luster of the solder, and to provide a solder paste made from this lead-free solder. Therefore, it is now possible to form a fillet where the metallic luster thereof can be minimized or delustered. For example, it is possible to form such a soldered portion that enables the inspection of defective soldering to be performed reliably and accurately by making use of an automatic inspection apparatus constituted by an image inspection apparatus employing the laser system for instance. Moreover, it is possible to obtain an electronic components-mounted substrate having a highly reliable circuit without deteriorating the properties such as solderability of the solder.

What is claimed is:

1. A lead-free solder comprising an element which is capable of generating a delustering component for minimizing metallic luster of the solder.

2. The lead-free solder according to claim 1, which comprises 2.0 to 4.0% of Ag, 0.1 to 1.0% of Cu, 0.05 to 0.5% of Bi, 0.05 to 0.5% of Sb, and the balance of Sn.

3. A solder paste composition comprising the powder of the lead-free solder claimed in claim 1, a rosin-based resin, an activating agent, and a solvent.

4. A solder paste composition comprising the powder of the lead-free solder claimed in claim 2, a rosin-based resin, an activating agent, and a solvent.

* * * * *